(12) United States Patent
El-Ghoroury

(10) Patent No.: US 7,266,487 B1
(45) Date of Patent: Sep. 4, 2007

(54) MATCHED INSTRUCTION SET PROCESSOR SYSTEMS AND METHOD, SYSTEM, AND APPARATUS TO EFFICIENTLY COMPILE HARDWARE AND SOFTWARE DESIGNS

(75) Inventor: Hussein S. El-Ghoroury, Carlsbad, CA (US)

(73) Assignee: Ellipsis Digital Systems, Inc., Carlsbad, CA (US)

( * ) Notice: Subject to any disclaimer, the term of this patent is extended or adjusted under 35 U.S.C. 154(b) by 839 days.

(21) Appl. No.: 10/156,170

(22) Filed: May 28, 2002

Related U.S. Application Data

(60) Provisional application No. 60/315,811, filed on Aug. 29, 2001.

(51) Int. Cl.
*G06F 17/50* (2006.01)
(52) U.S. Cl. ............................................ 703/14; 716/1
(58) Field of Classification Search ................. 703/14; 716/1
See application file for complete search history.

(56) References Cited

U.S. PATENT DOCUMENTS

| | | | |
|---|---|---|---|
| 5,623,684 A | 4/1997 | El-Ghoroury et al. | |
| 5,867,400 A * | 2/1999 | El-Ghoroury et al. | 716/1 |
| 6,120,549 A * | 9/2000 | Goslin et al. | 703/20 |
| 6,216,258 B1 * | 4/2001 | Mohan et al. | 716/17 |
| 6,226,776 B1 * | 5/2001 | Panchul et al. | 716/3 |
| 6,233,540 B1 * | 5/2001 | Schaumont et al. | 703/14 |
| 6,484,304 B1 * | 11/2002 | Ussery et al. | 716/18 |
| 7,000,213 B2 * | 2/2006 | Banerjee et al. | 716/18 |
| 7,055,019 B2 * | 5/2006 | El-Ghoroury | 712/203 |
| 2002/0100029 A1 * | 7/2002 | Bowen | 717/140 |

OTHER PUBLICATIONS

Bart Kienhuis et al.; "Compaan: Deriving Process Networks from Matlab for Embedded Signal Processing Architectures", 2000, Proceedings of the Eighth International Workshop on Hardware/Software Codesign.*
Josef Fleischmann et al.; "Protoyping Networked Embedded Systems", 1999, Computer, Feb. 1999, vol. 32, Issue 2.*
Weizheng Wang, "Simulink Communications Toolbox", 1997, The MathWorks, Inc.*
Daniel D. Gajski et al.; "System Design Methodologies: Aiming at the 100 h Design Cycle", 1996, IEEE Transactions on Very Large Scale Integration Systems, vol. 4, No. 1, Mar. 1996.*

(Continued)

*Primary Examiner*—Paul Rodriguez
*Assistant Examiner*—Russ Guill
(74) *Attorney, Agent, or Firm*—Blakely Sokoloff Taylor & Zafman LLP

(57) ABSTRACT

This invention relates to matched instruction set processor systems and method, system, and apparatus to efficiently compile hardware and software designs. A method to efficiently design and implement a matched instruction set processor system includes analyzing and mapping design specifications of the matched instruction set processor into application components, wherein each application component represents a reusable function commonly used in digital communication systems. The method further includes decomposing the matched instruction set processor system into interconnected design vectors. The method also includes examining fields of the interconnected design factors and mapping the interconnected design vectors into specific hardware and software elements.

8 Claims, 9 Drawing Sheets

OTHER PUBLICATIONS

Volker Aue et al.; "MATLAB based codesign framework for wireless broadband communication DSPs", Proceedings of 2001 IEEE International Conference on Acoustics, Speech, and Signal Processing, 2001, vol.2, May 2001.*

P. Banerjee et al.; "A MATLAB compiler for distributed, heterogeneous, reconfigurable computing systems", Apr. 2000, 2000 IEEE Symposium on Filed Programmable Custom Computing Machines, pp. 39-48.*

M. Haldar et al.; "FPGA hardware synthesis from MATLAB", Jan. 2001, Fourteenth International Conference on VLSI Design, pp. 299-304.*

M. Haldar et al.; "Automated synthesis of pipelined designs on FPGAs for signal and image processing applications described in MATLAB", Feb. 2001, Design Automation Conference, Proceedings of the ASP-DAC 2001, Asia and South Pacific, pp. 645-648.*

Maya Gokhale et al.; "Stream-Oriented FPGA Computing in the Streams-C High Level Language", Apr. 2000, IEEE Symposium on Field Programmable Custom Computing Machines, pp. 49-56.*

Slomka et al.; "Generating mixed hardware/software systems from SDL specifications", 2001, Proceedings of the Ninth International Symposium on Hardware/Software Codesign, pp. 116-120.*

Kuhn et al.; "Description and Simulation of hardware/software systems with Java", 1999, Proceedings of 36th Design Automation Conference, pp. 790-793.*

* cited by examiner

```
/** Vector Attributes */
  string vectorName;
  string vectorType;
  string parentAS;
```

```
/** Header variables */
// Add input variable declarations
  Object headerVar[];
/** Trailer variables */
// Add output variable declarations
  Object trailerVar[];
```

```
                                                                    370
                     372                                            /
    /** Vector Constructor Method: Construct an actor with the given vector name */
    public udmVectorClassName (string vectorName, udmVector inVector[], udmVector
outVector[])
    {   // Call constructor in base class
        super(vectorName, parentAS, inVector, outVector);
        // Perform any initialization that needs to be done in the constructor
    }

/** This method contains the actual behavior of the vector   */
    private boolean vectorRun()
    {                        ‾‾‾‾‾ 374
        // Perform the vector processing
        return true;  // (or false if you want to terminate the thread)
    }

/** This is the invocation method that checks to see if the vector is ready to run */
    private void vectorInvocation()
    {                           ‾‾‾‾‾ 376
        while ( !headerDataReady() ) vectorWait();
    }

/** Get the header input data */
    private void getHeaderInput()
    {                         ‾‾‾‾‾ 378
        // Get input data from interconnect vector
        headerData = vectorGet();
    }

/** Send the trailer output data  */
    private void sendTrailerOutput()
    {                            ‾‾‾‾‾ 380
        // Send output data to the interconnect vector
        vectorSend( trailerData );
    }

/** run is the method that is started by Java when the thread is started */
    public void run()
    {              ‾‾‾‾‾ 382
        boolean runThread = true;

// Initialize the vector
        initialize();
        while ( runThread )
        {
            // Call invocation method
            vectorInvocation();

// Get input data
            getHeaderInput();

// Do the processing for the vector
            runThread = vectorRun();

// Send output data
            sendTrailerOutput();
        }

// Perform final cleanup before vector thread exits
        wrapup();
    }
```

Figure 3D

MATCHED INSTRUCTION SET PROCESSOR SYSTEMS AND METHOD, SYSTEM, AND APPARATUS TO EFFICIENTLY COMPILE HARDWARE AND SOFTWARE DESIGNS

RELATED APPLICATIONS

This application claims the benefit of U.S. Provisional Patent Application No. 60/315,811 filed on Aug. 29, 2001.

BACKGROUND (1) Field

This invention relates to matched instruction set processor systems and method, system, and apparatus to efficiently compile hardware and software designs.

(2) General Background

Traditional Application Specific Integrated Circuit (ASIC) design methods and the "Fabless Integrated Circuit (IC)" business model have worked well for the personal computer (PC) industry for many reasons. The primary reason is that PC design requirements typically do not radically change from one product to another. In comparison, the wide spread proliferation and constant evolution of the communications standards cause product design requirements of digital communication products to significantly change from one product to the next product. As a result, the overhead resulting from applying ASIC design methods and the "Fabless IC" business model to Digital Communications products are far more excessive.

Generally, the value that a typical digital communication semiconductor company following the "Fabless IC" business model offers is concentrated in the design content of the IC. Typically, the semiconductor technology offered by many fabless semiconductor companies is merely a redesign and re-packaging of components that the companies have previously designed. These fabless companies generally expend disproportional monetary and human resources to re-package various communication components to produce products. Therefore, chip design cycles normally assume a substantial portion of the total cost of final products.

There are several other significant shortcomings of the "Fabless IC" business model and ASIC design methods when applied to the development of digital communication products. These shortcomings arise basically from the fact that the implementation of digital communication products typically includes embedded software that is not well integrated into the design process. Some exemplary shortcomings may include:

Lack of a unified hardware (HW) and software (SW) design approach, leading to difficulties in verifying the integrated design, and hence incompatibilities across the hardware and software boundary.

Tendency to define a priori a partitioning of hardware and software, leading to rigid and sub-optimal designs.

Lack of well-defined design flow, making specification revision difficult and hence impacting time-to-market.

Lack of built-in techniques within the design process to promote reusability and portability, preventing timely reaction to market trends and leading to the inability to leverage attained market position.

As a result, it is desirable to have a new approach to communication processor design and design methodology that could overcome the aforementioned shortcomings and that is more compatible with the market evolution cycles in the digital communication semiconductor industry.

BRIEF DESCRIPTION OF THE DRAWINGS

FIG. 3D shows exemplary Methods of an exemplary UDM Design Vector in accordance with one embodiment of the present invention.

DETAILED DESCRIPTION OF THE INVENTION

Figure 1A:
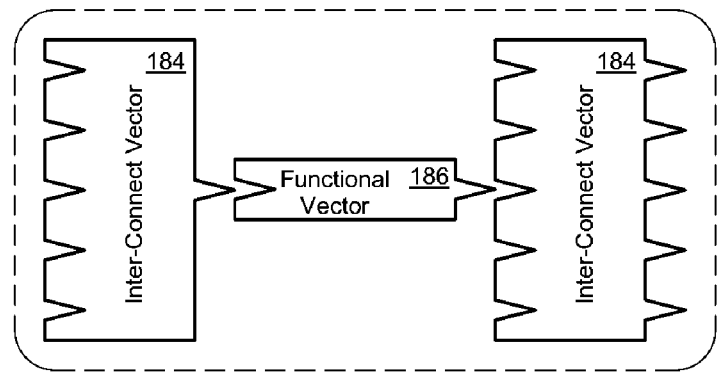
FIG. 1A illustrates two exemplary types of Vectors in accordance with one embodiment of the present invention.

This invention relates to matched instruction set processor systems and method, system, and apparatus to efficiently compile hardware and software designs.

Virtual Integrated Circuits (IC) are generally IC products whereby both of the software as well as the hardware aspects of the product are unified into a seamless architecture. Soft Products are generally Virtual Integrated Circuits designed to address a specific application but not targeting a specific hardware technology, platform or semiconductors technology and can be realized into an Application Specific Standard Product (ASSP) or run on a re-configurable hardware Platform.

The Virtual IC design method and business model can overcome many of the shortcomings of the "Fabless IC" model. In the Virtual IC model both of the software as well as the hardware aspects of the product design are unified into a seamless and unified design method. Furthermore, the hardware and software design aspects remain unified until the latter stages of the design are reached, thus allowing maximum flexibility to alter the functional allocation and partition between the hardware and the software aspects.

In the Virtual IC model, the design is not committed to a specific hardware architecture, technology or foundry. Rather, the overall product design is verified and validated against the product design requirements then ported to the desired hardware architecture, the preferred technology and target foundry. This front-end design process independence prevents the dilution of the product designers' value-added encountered in the Fabless IC model while retaining the flexibility to port the design to any desired hardware architecture, technology or foundry. Furthermore, the decoupling of the chip design from the product design frees hardware designers to evolve and eventually replace their designs without perturbing legacy product designs.

In the Virtual IC model, design modularity is an integral attribute of the design and is incorporated at the onset of the design process. The design modularity in the Virtual IC model is done in such a way that any single module can be committed to either hardware or software implementation and can be reused from one product realization to another. In effect the design modularity provisions in the Virtual IC model allows hardware/software partition flexibility as well as reusability.

In summary, the Virtual IC model attains maximum efficiency for Digital Communication products through Portability across hardware platforms and Reusability across digital communication standards.

Matched Instruction Set Processors are generally processors that can be adapted or reconfigured to support a variety of base instruction sets. These processors can be matched to individual tasks that a communication processor is expected to perform. As a result Matched Instruction Processors are good candidates for implementing communication processors targeted to changing communication applications and standards. As such, Matched Instruction Set Processors support reconfigurable computing architectures, thereby enabling adaptation of hardware resources to perform a specific computation. Reconfigurable computing architectures can provide an alternate paradigm to utilize the available logic resources on the chip. For several classes of applications (including digital communication applications), Matched Instruction Set Processors that support reconfigurable computing architectures could provide power optimization, cost reduction, and enhanced run-time performance.

Matched Instruction Set Processors are made up of specific hardware and software objects or elements. These processors can be described as multiple parallel-processing pipelines that contain interconnected Functional and Interconnection Vectors, with each of the Application Models corresponding to one or more Vectors.

In one embodiment, each parallel-processing pipeline can contain one or more Functional Vectors and/or Interconnect Vectors. A Vector can be generally defined as a portion of a processing pipeline that requires no further parallelism. A Functional Vector generally contains design information for one or more functional aspects of the processing pipeline. An Interconnect Vector generally contains design information for connectivity characteristics.

FIG. 1A illustrates two exemplary types of Vectors in accordance with one embodiment of the present invention. Vectors are the most basic building blocks with which the terminal architectural model can be constructed. As shown in FIG. 1A, two exemplary types of Vectors include Functional Vectors 186 and Interconnect Vectors 184. In one embodiment, each Functional Vector 186 can be dedicated to performing a single function of transforming the input variables into the output variables. It should be noted that Functional Vectors 186 could be restricted to receive their input variables from a single Interconnect Vector and deliver their output variables to a single Interconnect Vector.

In one embodiment, Interconnect Vectors 184 can be used to provide the interconnectivity between Functional Vectors 186. Each Interconnect Vector 184 can typically perform the functions required to contain and transport shared and global variables between Functional Vectors 186. If an Interconnect Vector 184 interconnects two Functional Vectors 186, variables exchanged between the two Functional Vectors 186 are shared variables. If an interconnect vector transports variables between more than two Functional Vectors 186, the transported variables are global variables.

Figure 1B:
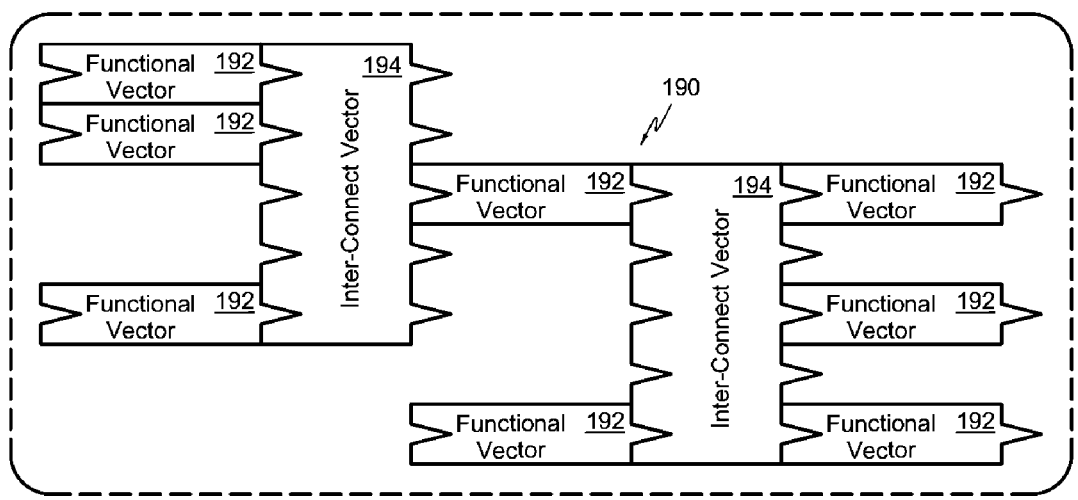
FIG. 1B shows an exemplary Terminal Structural model expressed in terms of a set of interconnected Functional Vectors in accordance with one embodiment of the present invention

FIG. 1B shows an exemplary Terminal Architectural model 190 that is expressed in terms of a set of interconnected Functional Vectors 192 in accordance with one embodiment of the present invention. Interconnect Vectors 194 are used to link or interconnect the Functional Vectors 192. As previously stated, Interconnect Vectors 194 and Functional Vectors 192 represent the lowest level of building blocks that will be used in building the terminal structural model. Each Vector is implemented by a Scaled Virtual Machine supporting the required computing capabilities. Examples of computing capabilities or features may include an instruction set, processing throughput requirement, memory requirement, etc. A Scaled Virtual Machine generally includes computing capabilities or features that represent a truncation or extension of pre-determined computing capabilities or features of a default virtual machine.

In one embodiment, the Java Virtual Machine (JVM) is used to implement the default virtual machine. In this embodiment, capabilities or features of the default virtual machine or the JVM can be extended or truncated to define an instance of the Scaled Virtual Machine that could meet the computing capabilities or features required by the Vector.

We will now describe the methodology to produce the aforementioned Matched Instruction Set Processor Architecture.

Figure 2A:
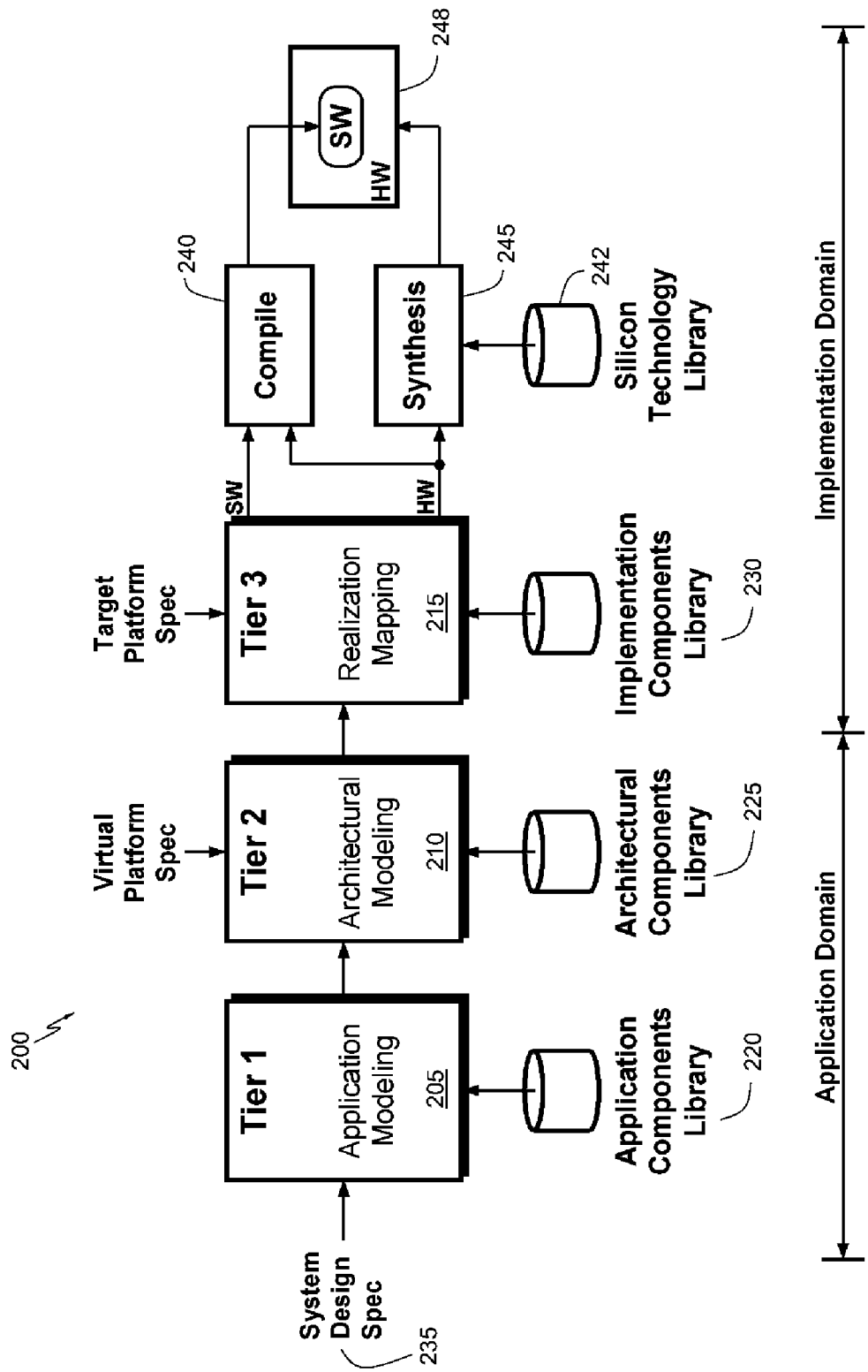
FIG. 2A is a diagram showing a plurality of exemplary tiers or stages in the Unified Design Methodology (UDM) in accordance with one embodiment of the present invention.

FIG. 2A is a diagram showing a plurality of exemplary tiers or stages 205, 210, 215 in the Unified Design Methodology (UDM) 200 in accordance with one embodiment of the present invention. The Unified Design Methodology 200 generally includes multiple tiers or stages 205, 210, 215. In each tier or stage 205, 210, 215, a different set of tasks is performed.

The Unified Design Methodology 200 generally provides an efficient technique to efficiently design and implement Matched Instruction Set Processors applicable to Virtual IC in general and digital communication Virtual IC in specific. Furthermore, the Unified Design Methodology 200 can enable the development of cost-effective digital communication Virtual IC products by incorporating all of the software as well as the hardware design aspects of the product and can be independently realized into a target hardware architecture, platform, or technology.

The Unified Design Methodology 200 is generally based on a multi-tier or multi-stage approach with each tier or stage 205, 210, 215 being supported by a corresponding design library 220, 225, 230. The Methodology 200 generally maps system design specifications 235 into hardware and software designs while allowing the incorporation of a preferred hardware specifications and constraints. Allocation or mapping of the system design to hardware and software is performed at the latter stages 240,245 of the Methodology 200. Therefore, the overall system design can be verified before being committed, allocated, or mapped to actual hardware and software platforms. Thus the Methodology 200 allows the system design to be substantially independent of hardware platform and semiconductors technology. As a result, the resulting system design and its constituent elements can be realized using any preferred hardware platform and semiconductors technology.

In general, a Behavioral Analysis of the system design flow is performed in Tier 1 205 to ensure compliance with system design specifications 235. The process of ensuring compliance with system design specifications 235 is called Behavioral Verification.

In Tier 1 205, system design specifications 235 are analyzed and mapped into one or more Application Components. Appropriate pre-existing Application Components can be extracted from an Application Components Library 220, modified (if required) to be compatible with system design specifications 235, and incorporated into the system design flow. System design requirements, including processing and timing requirements, can also be allocated or mapped to the Application Components.

Each Application Component generally represents a reusable function commonly used in digital communication systems. A Functional Element generally represents a group of related functions, each of which performing specific tasks common to digital communication systems. Accordingly, each Functional Element can be composed of a group of interconnected Application Components.

Figure 2B:
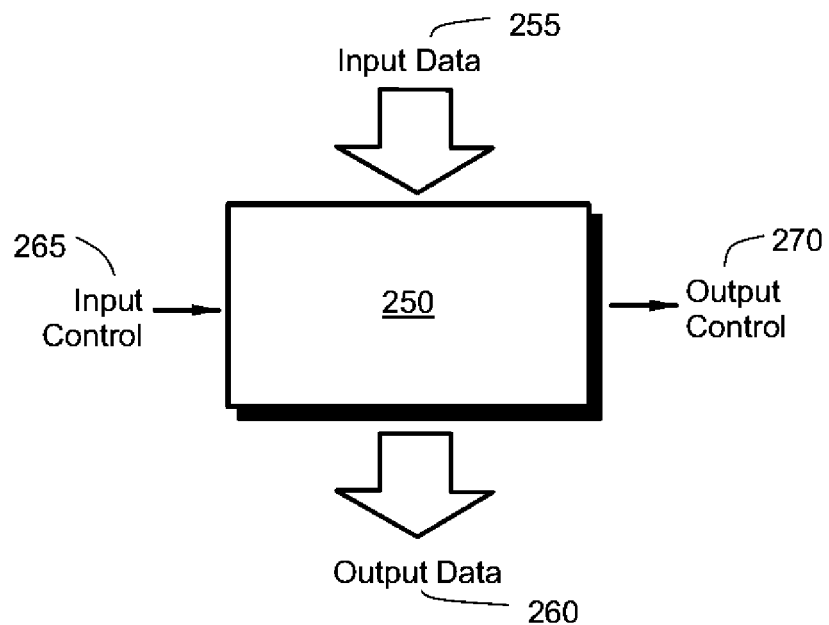
FIG. 2B shows an exemplary template for Functional Elements or Application Components in accordance with one embodiment of the present invention.

FIG. 2B shows an exemplary template 250 for Functional Elements or Application Components in accordance with one embodiment of the present invention. Input Data 255 provides data to the Functional Element/Application Component 250. Functional Element/Application Component 250 generally processes the Input Data 255 and generates the Output Data 260. In processing the Input Data 255 and generating the Output Data 260, the Functional Element/Application Component 250 could maintain an internal state. Output Data 260 generally conveys the data output of the Functional Element/Application Component to another Functional Element or Application Component. Input Control 265 generally provides control input to the Functional Element/Application Component 250.

In one embodiment, the Input Control 265 may include timing information, processing preemption, configuration commands, or other control information. Output Control 270 generally provides control output from the Functional Element/Application Component. In one embodiment, the Output Control 270 may include operational status and other timing information that may be needed by another Functional Element/Application Component.

The result of Tier 1 205 is generally a Behavioral Model that can be used to verify compliance with system design specifications 235. As a result, engineering designers can think in high-level abstraction. It should be noted that no specific assumption is made in Tier 1 205 regarding the allocation of the system design specifications 235 and requirements into hardware and software. It should also be noted that Application Components residing in the Application Components Library 220 could be defined in a manner that will promote and enable reusability of the modules across various different digital communication standards.

Figure 2C:
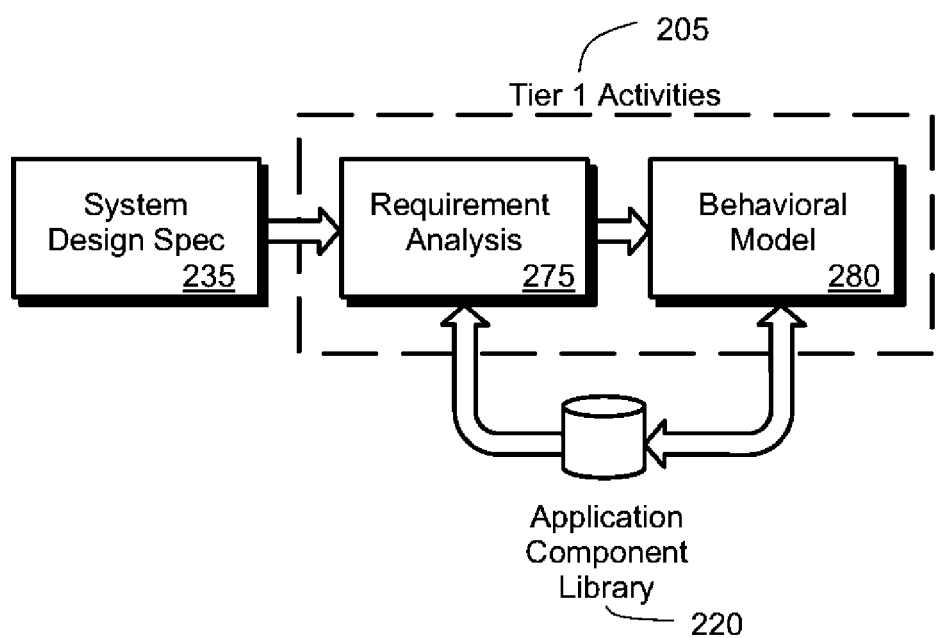
FIG. 2C illustrates the overall approach for the development of the behavioral model in accordance with one embodiment of the present invention.

FIG. 2C illustrates the overall approach for the development of the Behavioral Model. System Design Specifications 235 generally provide the requirements input to the Requirement Analysis phase 275 of Tier 1 205. Furthermore, the Application Components Library 220 contains existing Application Components that could be used during the generation of the Behavioral Model 280. In general, the Behavioral Model 280 can be generated using existing Application Components in the Application Components Library 220 and new Application Components identified during the Requirement Analysis phase 275. New Application Components can be saved in the Application Components Library 220 upon completion of the generation of the Behavioral Model 280 for later usage.

In some cases, each Application Component has some corresponding Architectural Components residing in the Architectural Components Library 225. If so, these corresponding Architectural Components are automatically incorporated in Tier 2 210 based on the Application Component generated in Tier 1 205.

If the Application Component generated in Tier 1 205 is a newly defined component, Architectural Components corresponding to the newly defined Application Component may need to be generated. To generate corresponding Architectural Components, a newly defined Application Component is first decomposed into one or more parallel processing pipelines in order to satisfy system processing and timing requirements.

Each parallel-processing pipeline can be further decomposed further into one or more Functional and Interconnect Design Vectors. A Design Vector can be generally defined as a portion of a processing pipeline that requires no further parallelism. A Functional Design Vector generally contains design information for one or more functional aspects of the processing pipeline. An Interconnect Design Vector generally contains design information for connectivity characteristics.

After each parallel-processing pipeline has been decomposed into one or more Design Vectors, the design of system can be represented by a set of interconnected Functional and Interconnection Design Vectors, with each Application Component generated in Tier 1 corresponding to one or more Design Vectors generated in Tier 2.

The processing requirements of each Design Vector can then be analyzed to determine computing capabilities or features that are needed to support the Design Vector. Examples of computing capabilities or features may include an instruction set, processing throughput requirement, memory requirement, etc. The required computing capabilities or features of each Design Vector can then be used to define a Scaled Virtual Machine. Thus, a Scaled Virtual Machine generally includes computing capabilities or features that represent a truncation or extension of pre-determined computing capabilities or features of a default virtual machine.

In one embodiment, the Java Virtual Machine (JVM) is used to implement the default virtual machine. In this embodiment, capabilities or features of the default virtual machine or the JVM can be extended or truncated to define an instance of the Scaled Virtual Machine that could meet the computing capabilities or features required by the Design Vector.

Figures 3A, 3B, 3C:
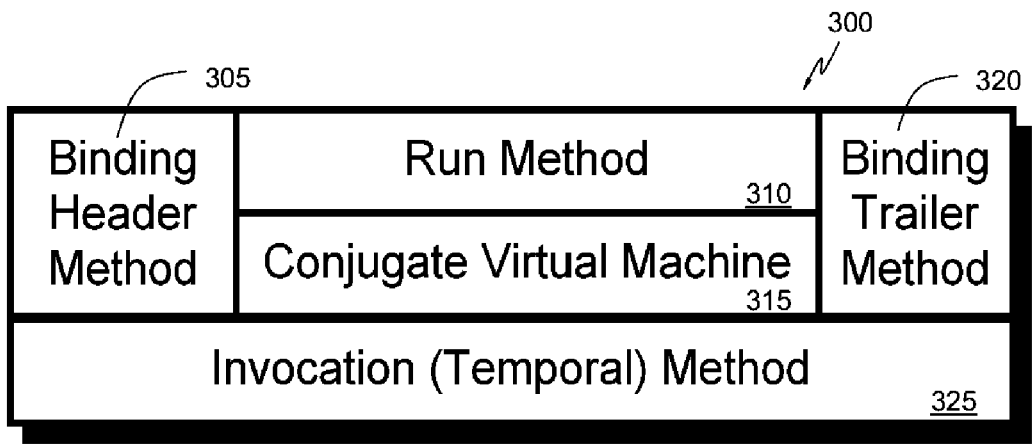
FIG. 3A illustrates the overall structure of an exemplary UDM Design Vector in accordance with one embodiment of the present invention.
FIG. 3B shows an exemplary set of Vector Attributes in accordance with one embodiment of the present invention.
FIG. 3C shows exemplary variables definitions in accordance with one embodiment of the present invention.

FIG. 3A illustrates the overall structure of an exemplary UDM Design Vector 300 in accordance with one embodiment of the present invention. The exemplary UDM Design Vector 300 can contain Run Method 310 and a definition of the "Matched" execution engine hardware, referred to as a Conjugate Virtual Machine (CVM) 315. Hence, the UDM Design Vector 300 can be represented as a software module executing on its own virtual (hardware) processor referred to as CVM. Header 305 and Trailer 320 contain the binding methods that connect the Design Vector 300 to other Design Vectors. Run Method 310 generally contains the behavior of the Design Vector 300.

In one embodiment, the Run Method 310 can include a Java software module that describes the processing to be performed by the UDM Design Vector 300. Temporal 325 typically contains the invocation method of the Design Vector. CVM 315 generally contains the description of the execution engine, which can be the JVM instruction subset that is needed to support the execution of the Run Method 310.

In one embodiment, the Header 305 generally contains the description of the input variables and the UDM Design Vectors that produce the input variables. In this embodiment, the Trailer 320 generally contains the description of the output variables and the UDM Design Vectors destined to receive the output variables.

In addition, the UDM Design Vectors 300 use the following types of Header and Trailer variables, including Local Variables, Shared Variables, and Global Variables. Local Variables are generally local within an UDM Design Vector. Shared Variables are typically shared between two Functional Design Vectors. Global Variables can be shared between several Functional Design Vectors.

Shared Variables and Global Variables can be accessed by multiple Design Vectors, and hence can be used to pass data between Design Vectors. Shared Variables and Global Variables are defined in the Header 305 and Trailer 320 of the Design Vector 300. Synchronization of access to Shared & Global Variables is performed data synchronization mechanisms provided by the selected design language. Examples of data synchronization mechanisms can include "wait( )" and "notify( )" methods, as defined by the Java programming language.

Temporal information 325 contains the invocation information and the maximum allowable response time within which the Design Vector 300 needs to complete its processing.

Conjugate Virtual Machine (CVM) field 315 generally includes design information describing required computing capabilities or features of the Scaled Virtual Machine that are minimally sufficient to execute the sequence of operations described in the Method field 310. Later in the Unified Design Methodology 200 (shown in FIG. 2A), the realization of the Scaled Virtual Machine as described in the CVM field 315 can be committed to either hardware or software depending upon the specified capabilities of a preferred platform 248 (shown in FIG. 2A). In one embodiment, the programming language can correspond to the default CVM that is being used. For example, the Java programming language would be used if the default virtual machine were a JVM. In this embodiment, the CVM describes the hardware that is the matched subset of the JVM instruction set generated by compiling the Design Vector Run Method.

Returning to FIG. 2A, the design of the system can be decomposed into a collection of interconnected Design Vectors in Tier 2 210 of the Unified Design Methodology 200 to fully capture hardware and software design aspects or features of the system. As stated above, the design information or specification of each interconnected Design Vector can be captured in a UDM Design Vector 200, as shown in FIG. 3A and described in the text accompanying the figure. Therefore, the collection of Design Vectors may be thought of as a detailed design document that captures hardware and software design aspects or features of the system.

As stated above, each of the interconnected Design Vector can be either a Functional Design Vector or an Interconnect Design Vector. In either case, the design of each Design Vector can be described using any design language. In one embodiment, the design language can be a programming language based on the object-oriented paradigm. An exemplary programming language based on the object-oriented paradigm is Java.

The description or specification of each UDM Design Vector should include hardware and software aspects or features. Thus, the design description or specification of each UDM Design Vector should be sufficiently complete to enable validation and verification against any design specifications that flows down to Tier 2 210 from Tier 1 205 of the Unified Design Methodology 200.

FIGS. 3B, 3C, and 3D together show an exemplary UDM Design Vector being implemented as a Java class. It should be noted that Javadoc comments are employed in the figures to further describe the UDM Design Vector. In one embodiment, the UDM Design Vector could include Class Name (i.e., name of the Java class that implements the exemplary UDM Design Vector), Design Vector Attributes, Variable Definitions, and Methods.

FIG. 3B shows an exemplary set of Design Vector Attributes 330, including Vector Name 335, Vector Type 340, and Parent Application Syntax 345. Vector Name 335 usually is the same as Class Name. Vector Type 340 can be used to indicate whether the vector is a Functional Vector or an Interconnect Vector. Parent Application Syntax name 345 is generally the Name of the Parent Vector.

FIG. 3C shows exemplary variables definitions 350 including Header 355 and Trailer 360 binding information. In one embodiment, the Header binding information 355 can include definitions of input variables and the name of the source vector generating these input variables. In this embodiment, the Trailer binding information 360 can include definitions of output variables and the name of the destination vector that will absorb these output variables.

FIG. 3D shows exemplary Methods 370 of an exemplary UDM Design Vector, including a Vector constructor method 372, a vectorRun( ) method 374, a vectorInvocation( ) method 376, a getHeaderInput( ) method 378, a sendTrailerOutput( ) method 380, a run( ) method 382, and other Java specific methods used to complete the vector—such as initialize( ), wrapup( ), vectorGet( ), vectorSend( ), vectorWait( ), headerDataReady( ), trailerDataReady( ).

The Vector constructor method 372 is generally called when the vector is first created. When called, the Vector constructor method 372 stores the Vector Attributes 330 (shown in FIG. 3B) and receives the Header and Trailer binding information 355, 360 (shown in FIG. 3C).

The vectorRun( ) method 374 can generally be invoked to perform the vector function. The vectorInvocation( ) method 376 generally contains the invocation and temporal information and waits until these requirements are satisfied. The getHeaderInput( ) method 378 can be used to obtain the Header binding information 355 (shown in FIG. 3C). The sendTrailerOutput( ) method 380 can be used to send the trailer variables to the bound vector that consumes the Trailer. The run( ) method 382 should exist in each Java thread and should be executed automatically when the Java thread is created.

Two exemplary types of UDM Design Vectors in accordance with one embodiment of the present invention were shown on FIG. 1A. The UDM Design Vectors are the most basic building blocks with which the terminal architectural model can be constructed. As shown in FIG. 1A, the two exemplary types of UDM vectors include Functional Vectors 186 and Interconnect Vectors 184. In one embodiment, each Functional Vector 186 can be dedicated to performing a single function of transforming the input variables into the output variables as described in the run( ) method 182

(shown in FIG. 3D) It should be noted that Functional Vectors 186 could be restricted to receive their input variables from a single Interconnect Vector and deliver their output variables to a single Interconnect Vector.

In one embodiment, Interconnect Vectors 184 can be used to provide the interconnectivity between Functional Vectors 186. Each Interconnect Vector 184 can typically perform the functions required to contain and transport shared and global variables between Functional Vectors 186. If an Interconnect Vector 184 interconnects two Functional Vectors 186, variables exchanged between the two Functional Vectors 186 are shared variables. If an interconnect vector transports variables between more than two Functional Vectors 186, the transported variables are global variables.

As previously stated, FIG. 1B shows an exemplary Terminal Structural model 190 that is expressed in terms of a set of interconnected Functional Vectors 192 in accordance with one embodiment of the present invention. Interconnect Vectors 194 are used to link or interconnect the Functional Vectors 192. As previously stated, Interconnect Vectors 194 and Functional Vectors 192 represent the lowest level of building blocks that will be used in building the terminal structural model.

Turning to FIG. 2A, in Tier 3 215 of the Unified Design Methodology 200, Design Vectors 300 (shown in FIG. 3A) are generally parsed and analyzed so that system design aspects or features can be mapped into specific hardware and software objects or elements.

In Tier 3 215, the hardware specifications and constraints of the preferred hardware platform can be superimposed on the output of Tier 2 210 to map designs of Vectors into detail designs of hardware and software objects or elements. Tier 3 215 is supported by an Implementation Components Library 230 containing detailed design of the Implementation Components that generally includes detailed designs of constituent elements of a Scaled Virtual Machine. Examples of constituent elements of the Scaled Virtual Machine may include instruction set primitives such as adder, multiplier, shifter, etc. The Implementation Components of Tier 3 215 can be expressed in the same design language used in Tier 1 205 and Tier 2 210.

Depending on the superimposed preferred hardware platform specifications and constraints, each Implementation Component can be mapped into specific hardware and software objects or elements in one of the following three ways. The Implementation Component can be substituted with an equivalent Component of the preferred hardware platform. In addition, the Implementation Component can be instantiated as a hardware element. Furthermore, the Implementation Component can be emulated using the Component of the preferred platform. Mapping of Implementation Components into one of three aforementioned ways is the general objective of Tier 3 215.

During the mapping process, data records generated in Tier 2 210 to describe interconnected Vectors are analyzed against the specifications and constraints of the preferred platform. Fields 305, 310, 315, 320, 325 in each Vector 300 (shown in FIG. 3A) are examined. Furthermore, design aspects or features of each Vector can be assigned to the preferred platform hardware, a supplementary hardware supporting the preferred platform, or software that will execute on the preferred hardware platform or the supplementary hardware supporting the preferred platform.

Generally if the Temporal or Timing Specification and the instruction set required to support each Vector are compatible with the capabilities of the preferred hardware platform, a collection of Vectors can be fused or grouped together and executed on one of the processing elements of the preferred hardware platform. In such a case, the Implementation Components of the fused or grouped Vectors can be substituted by the equivalent Implementation Components of the preferred hardware platform or emulated using the Implementation Components of the preferred platform. However if the Temporal or Timing Specification or the instruction set required to support a Vector prohibits direct mapping or emulation of the Vector to the preferred hardware platform, the Scaled Virtual Machine of the Vector would be mapped or allocated to hardware and software elements supplementing the preferred platform.

Accordingly at the end of the mapping process, the design of each Vector can be mapped or allocated to specific hardware and/or software objects or elements. The specifications of the preferred platform together with the description of the supplementary hardware elements will typically describe the system hardware required to run the system software objects or elements.

Figure 4:
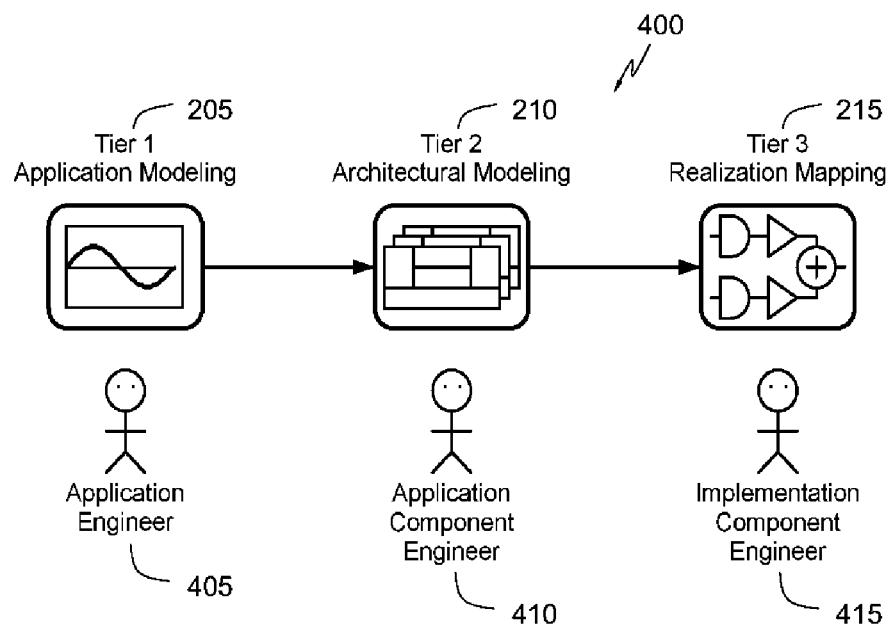
FIG. 4 illustrates a three-tier component-based system that enables design reuse in accordance with one embodiment of the present invention.

FIG. 4 illustrates a three-tier component-based system 400 that enables design reuse in accordance with one embodiment of the present invention. The three-tier component-based approach is shown along with the associated engineering skill category at each tier.

In Tier 1 205, engineers or experts 405 in the application (e.g., Wireless LAN, 2G & 3G Wireless Systems, Broadband Cable & xDSL Systems, etc) typically create system-level (product) behavioral models of the specified product by integrating behavioral models using the application components provided in Tier 1 library. In Tier 1, the application engineer 405 need not be an expert in the internal design aspects of the application components. Rather, the application engineer 405 is an expert in the application (product) itself and the way the application components should be integrated to fulfill the application design requirements.

In Tier 2 210, engineers or experts 410 in the application components (e.g., Demodulators, Decoders, Vocoders, etc) can typically create architectural models (i.e., detailed design models) of the application components. The constituent elements of these architectural models are the Design Vectors, which are collected in the Tier 2 library and have a one-to-one correspondence with the application components behavioral models in the Tier 1 library. In Tier 2, the application component engineer 410 typically does not have to be an expert in the internal design aspects of the implementation components. Rather, the application component engineer 410 can be an expert in the design of the application component itself and the way the implementation components should be integrated to fulfill the application component design requirements. The application components architectural models (represented by Design Vectors) can generally be designed in such a way that they can be mapped, through the Tier 3 realization mapping process, to software executing on either a target platform or dedicated hardware processing nodes. These dedicated hardware processing nodes can be realized using implementation components incorporated in Tier 3 Implementation Components Library.

In Tier 3 215, engineers or experts 415 in the implementation components (e.g., microprocessors, multipliers, adders, buses, memory, etc) can typically create gate-level models of the implementation components. These gate-level models can be designed in such a way that they can be mapped through a synthesis process to a specified semiconductor process. In addition, the implementation components can also be designed in such a way that allows them to be mapped into a soft realization utilizing a set of external implementation components. External in this context is meant to refer to implementation components inputted to the UDM flow in Tier 3 415 in the form of a target platform specifications and constraints.

The mapping of the Design Vectors into one of the design realization alternatives can generally be the essence of the Tier 3 design process. This mapping can be accomplished by analyzing the Design Vectors generated in Tier 2 versus the target platform specifications and constraints. The analysis process generally involves examining various fields of the Design Vectors in order to map the design aspects of each Design Vector to either the target platform, or to dedicated hardware processing nodes that will supplement the target platform.

Depending upon the temporal aspects and the instruction set specified by the hardware definition (CVM) field of each Design Vector, a Design Vector can be mapped to execute on one of the processing nodes of the target hardware platform. In cases where the temporal aspects of a Design Vector prohibit direct mapping of the Design Vector onto one of the processing nodes of the target platform, the CVM specifications generated in Tier 2 can be allocated to hardware that will supplement the target platform. As such, Tier 3 can be thought of as a two-dimensional compiler that parses the Design Vectors and maps their corresponding design specifications into software and/or hardware realizations.

As explained earlier, in Tier 1 205 the application product engineer generally integrates behavioral models of the application components to map the product design specification into product behavioral models that can be verified against the specified requirements. The transition from Tier 1 205 (application product realm) to Tier 2 210 (application components realm) can generally be bounded through the use of the most commonly used and essential components of the application field, for example the digital communications field. As a result, the application component engineer needs to be concerned only with a bounded set of implementation components when designing the application components. For example, in the case of the digital communications field, the bounded set of application components can include components such as demodulators, decoders, interleavers, and multiple-access protocol design components.

Similarly, the transition from Tier 2 210 (application components realm) to Tier 3 215 (implementation component realm) can also be bounded. Such transition can be generally bounded by the instruction set architecture (ISA) of the default virtual machine, which is used as the bases for creating the architectural models in Tier 2 210. In other words, the Tier 3 implementation components can be a realization of the default virtual machine instruction set and the associated micro-architectural elements. The implementation component engineer needs to be concerned only with a finite set of realization components.

In cases where the temporal aspects of a Design Vector prohibit direct mapping onto the target platform, the CVM specifications generated in Tier 2 can be allocated to hardware that will supplement the target platform. In this case, Tier 3 Realization Mapping would generally yield an instantiation of the CVM based on the characterization provided in the Design Vector CVM hardware definition field. The CVM can be instantiated by retrieving the appropriate set of Implementation Components from Tier 3 Library and by using these components to assemble the processing node hardware designs that are compliant with the CVM specifications.

Figure 5:
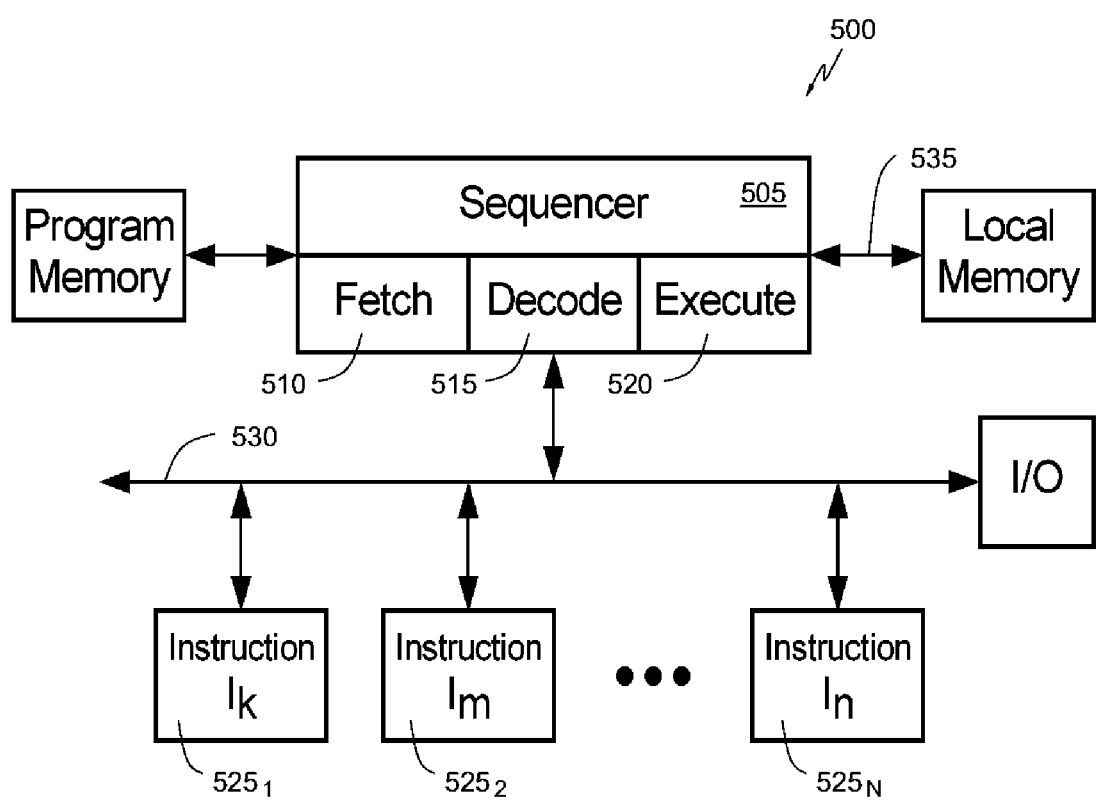
FIG. 5 shows an exemplary implementation template that can be used to instantiate a CVM in accordance with one embodiment of the present invention.

FIG. 5 shows an exemplary implementation template 500 that can be used to instantiate a CVM in accordance with one embodiment of the present invention. A processing node hardware design that is compliant with the CVM specifications can be assembled based on predefined processing node hardware template. The template 500 provides the general basis to assemble Implementation Components retrieved from Tier 3 Library to realize the processing node hardware design that complies with the CVM specifications. The process of assembling a processing node hardware design that is compliant with the CVM specifications can be a compilation process and as such can be referred to as "Hardware Compilation".

In one embodiment, the processing node implementation template can generally include three categories of Implementation Components, namely:

1. A sequencer 505 that can fetch 510, decode 515 and execute 520 instructions $525_1, 525_2, \ldots, 525_N$, where "N" is a positive integer;

2. Instructions $525_1, 525_2, \ldots, 525_N$ that are compliant with the type of instruction specified by the CVM field of the Design Vector; and 3. Glue elements (such as instruction bus 530, memory bus 535, clocks, etc.) that are needed to stitch together the sequencer and the instructions $525_1, 525_2, \ldots, 525_N$.

Using the implementation template, the CVM instantiation into hardware processing nodes can be accomplished by a Tier 3 Hardware Realization Compiler as follows:

1. Parse the CVM specifications field of the Design Vector.

2. Identify certain items or components, including:
   a. A subset of instructions required to instantiate the CVM,
   b. Required (most appropriate) sequencer element,
   c. Required glue elements; and 3. Retrieve Synthesizable Register Transfer Level (RTL) Model of each required implementation component from the Tier 3 Library and link these RTL models based on the architecture shown above to form a Synthesizable RTL model of the CVM.

Figure 6:
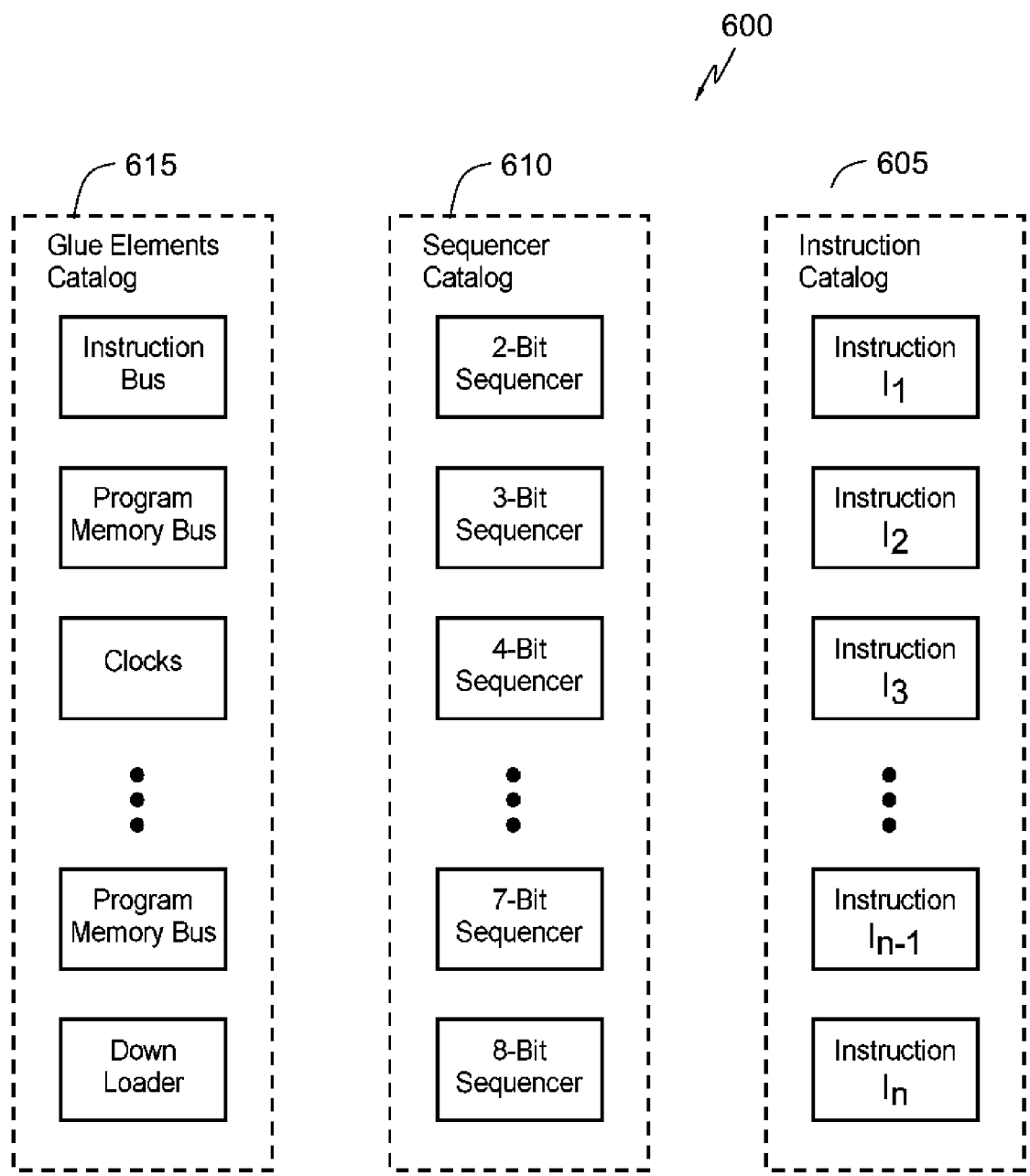
FIG. 6 shows an exemplary Tier 3 library of implementation components in accordance with one embodiment of the present invention.

FIG. 6 shows an exemplary Tier 3 library 600 of implementation components in accordance with one embodiment of the present invention. As shown the figure, the implementation components in the Tier 3 library generally consist of the following catalogs:

1. An instruction catalog 605 that generally includes synthesizable RTL models of each instruction of the Default Virtual Machine (DVM) ISA (currently we are using the JVM ISA as the DVM ISA);

2. A sequencer catalog 610 that generally includes synthesizable RTL models of sequencers incorporating instructions, each capable of fetch, decode, and execute operations; and 3. A glue elements catalog 615 that generally includes synthesizable RTL models of the glue elements needed to integrate the required subset of instructions together with the most appropriate sequencer As such, the output of Tier 3 Realization Mapping can be a Synthesizable RTL model of the instantiated CVM. Similar instantiation of CVMs associated with the Interconnect Design Vectors can result in the hardware and software realizations of the interfaces between an instantiated CVM and the target platform.

In cases when a particular target hardware platform is not specified, the system specifications can be mapped into synthesizable hardware platform consisting of an interconnected array of hardware processing nodes together with the software required to implement system functionality. As such, the CVM field of each Design Vector contained in the system architectural model is compiled into synthesizable RTL as described earlier.

Figure 7:
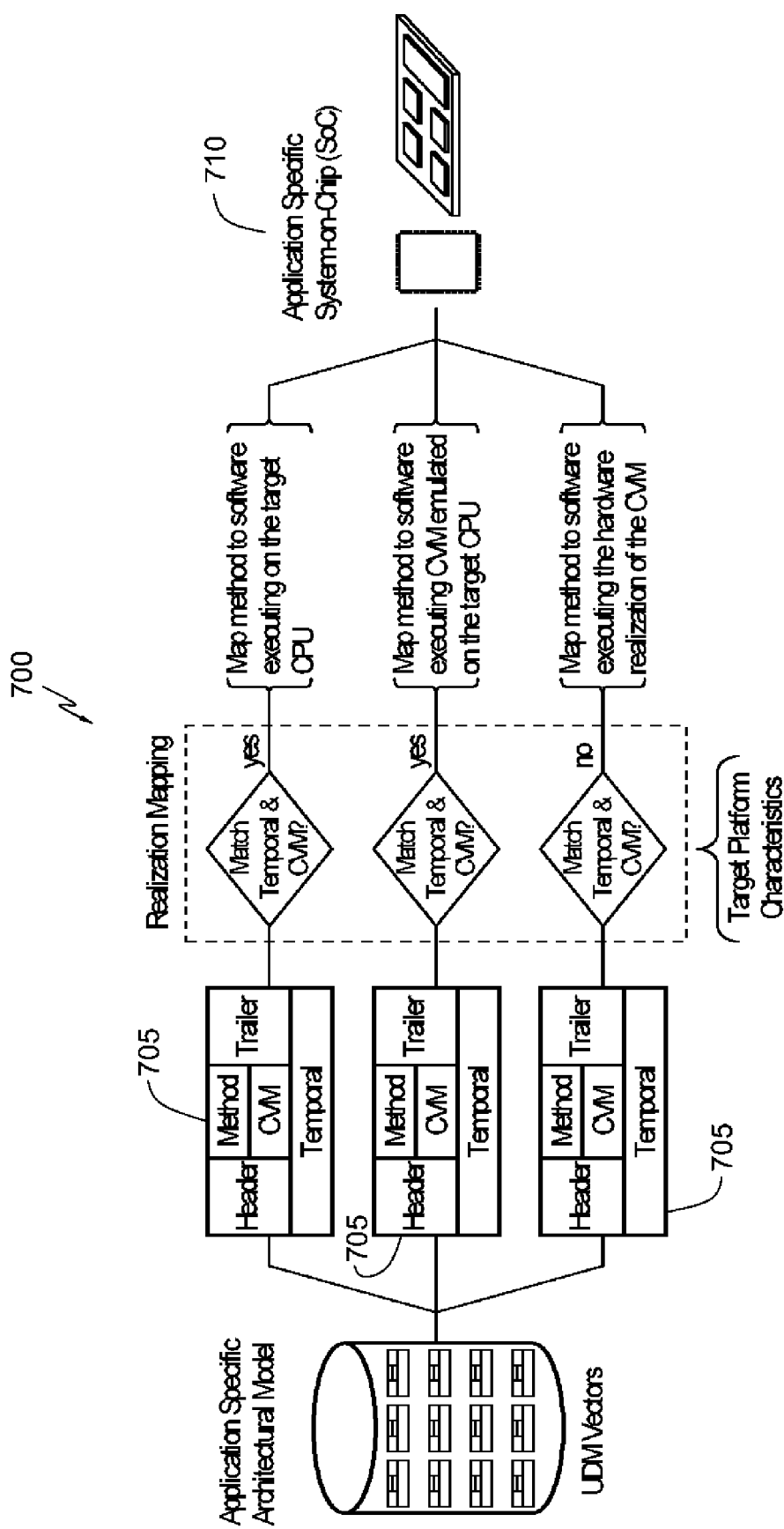
FIG. 7 illustrates an exemplary realization of mapping of UDM Design Vectors 705 in accordance with one embodiment of the present invention.

FIG. 7 illustrates an exemplary realization 700 of mapping of UDM Design Vectors 705 in accordance with one embodiment of the present invention. Portability can be enabled by allowing the UDM internal implementation components to be mapped in Tier 3 to an external set of implementation components. The following text will describe how the portability aspects of the UDM works for porting the UDM Design Vectors 705 to desired external implementation components, collectively referred to as the target platform 710. At this point, one should recall that the application (product) is designed using the UDM application components, which in turn is designed using the UDM internal set of implementation components.

First, one should typically ascertain that the temporal aspects of the Design Vectors to be mapped could be satisfied by the target platform. That is the throughput needs of the Design Vectors to be mapped can be met by the target platform. If the target platform throughput cannot support the application component temporal requirements, then the UDM internal implementation component, specified to operate at the needed throughput, should be used to realize the CVM associated with the Design Vector as described above. However, if the target platform throughput can support the temporal requirements of the Design Vector, then the UDM internal implementation components used in the design of the Design Vector are substituted by the appropriate external implementation components associated with the target platform 710.

Figure 8:
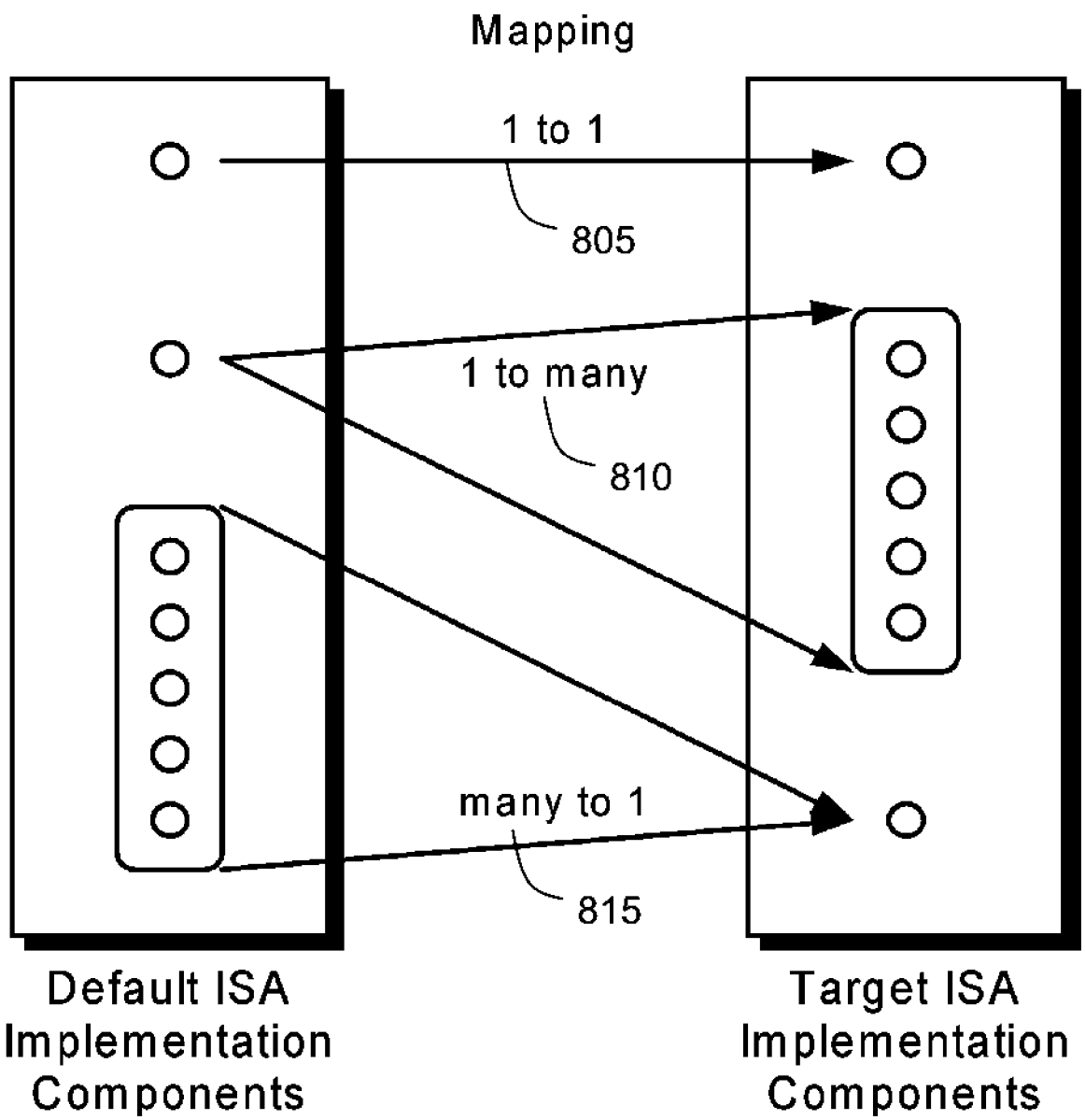
FIG. 8 illustrates various exemplary cases of realization mapping from the default ISA (instruction set architecture) to the target ISA.

FIG. 8 illustrates various exemplary cases of realization mapping from the default ISA to the target ISA. In one case, there is a one-to-one equivalence 805 from the internal to the external implementation components. In this case, the realization mapping in Tier 3 can be accomplished through straightforward substitution. "One-to-one equivalence" 805 generally means that at a lower performance bound defined by the temporal specification of the UDM internal implementation component, the external implementation component associated with the target platform should have the throughput capability to meet or exceed the temporal specifications of the UDM internal implementation component to be mapped. A typical example of the one-to-one matching would be the mapping of the UDM internal implementation components ADD or MULTIPLY to the corresponding implementation components of the target platform.

In another case, there is a one-to-many equivalence 810 from the internal to the external implementation component sets. In this case, the realization mapping in Tier 3 can be accomplished through a soft realization mapping in which the specified capabilities of the of the internal implementation component is realized using a program sequence of a set of external implementation components that are associated with the target platform. An example of this case would be if the UDM internal implementation component to be mapped were complex, such as add-compare-select (ACS) that has no one-to-one equivalence in the target platform. In such a case, the Tier 3 realization mapping is accomplished by substituting the UDM ACS implementation component with the appropriate set of target platform instructions.

In an alternative case, there is a many-to-one equivalence 815 from the internal to the external implementation components. In this case, the Tier 3 realization mapping can be accomplished through a compilation process through which a set of internal implementation components are grouped together and substituted by the collectively equivalent external implementation component associated with the target platform. An example of this case would be if a multiply-and-accumulate (MAC) instruction exists in the target platform ISA but not in the default virtual machine ISA. In such a case, the Tier 3 realization mapping is accomplished by substituting a target platform MAC instruction whenever a multiply and an accumulate implementation components are used consecutively.

Customer specific components, other than processors, can be handled by the UDM in a similar manner, i.e., viewed as external components. In such cases, the entire design vector, or a group of design vectors, may have to be substituted by a customer specific (external) component. As an example, the customer prefers that we incorporate some of their intellectual property, such as a Viterbi Decoder. In such a case, the group of Tier 2 Design Vectors representing the Viterbi Decoder will be substituted, both hardware and software aspects, by the customer's Viterbi Decoder. Of course, it should be ascertained that the externally supplied Viterbi Decoder could satisfy the temporal aspects of the mapped designed vectors, and that the binding aspects of the mapped design vectors are mapped properly. The ability of the Ellipsis' UDM to map Tier 2 Design Vectors to either an internal or an external set of implementation components is an important attribute of the UDM because it allows the fully verified design of Tier 2 to be mapped (ported) to any set of external implementation components, whether a target processor or an application specific component.

Analog and mixed signal components, such as analog-to-digital converters and digital-to-analog converters, can also be handled by the UDM and can be viewed as internal or external components. In this case, however, the Tier 2 models of the application components are viewed as Behavioral Models rather than a Structural Model, i.e., specifying the capabilities of the application component rather than the specific design of that component. (Recall that the design environment used throughout the UDM flow; namely Ptolemy II, has the capability to model heterogeneous types of components such as digital, analog, and mixed signal.) Thus, with the UDM design flow, it is possible to construct a behavioral model of the entire system representing the digital, analog and mixed-signal design aspects of the system. For the digital design aspects, the UDM enables the designer to construct a structural model and to map such a model to an implementation using implementation components compiled in the Tier 3 library. Alternatively for analog and mixed signal components, one can construct Physical Design Models targeting a specific semiconductor process that satisfies the design specifications delineated by the application component behavioral model. Although this approach does not offer the semiconductor process independence as in the case of the digital component, it does, however, allow the entire system to be specified and be verified at the behavioral level collectively.

It should be noted that the functional components illustrated in the above-referenced figures and discussed above could be implemented in hardware or software. If the aforementioned functional components are implemented in software, these components can be stored on a computer-readable medium, such as floppy disk, hard drive, CD-ROM, DVD, tape, memory, or any storage device that is accessible by a computer.

While certain exemplary embodiments have been described and shown in accompanying drawings, it is to be understood that such embodiments are merely illustrative of and not restrictive on the broad invention, and that the invention not be limited to the specific constructions and arrangements shown and described, since various other modifications may occur to those ordinarily skilled in the art.

What is claimed is:

1. A method to design and implement a matched instruction set processor system, including:
   analyzing and mapping system design specifications of the matched instruction set processor system into application components, each application component representing a reusable function used in digital communication systems;
   decomposing the application components of the matched instruction set processor system into interconnected design vectors;
   examining fields of the interconnected design vectors including
      mapping the interconnected design vectors to dedicated hardware processing nodes,
      parsing Conjugate Virtual Machine (CVM) fields of the interconnected design vectors, and
      synthesizing Register Transfer Level models based on information obtained from parsing the CVM fields; and
   selecting and implementing specific hardware and software elements according to the Register Transfer Level models.

2. The method of claim 1, wherein examining fields of the interconnected design vectors and mapping the interconnected design vectors further includes:
   mapping the interconnected design vectors to a target platform.

3. The method of claim 1, wherein mapping the interconnected design vectors to dedicated hardware processing nodes further includes:
   generating a sequencer that can fetch, decode, and execute.

4. The method of claim 1, wherein mapping the interconnected design vectors to dedicated hardware processing nodes further includes:
   generating instructions that are compliant with instructions specified by the interconnected design vectors.

5. The method of claim 4, wherein mapping the interconnected design vectors to dedicated hardware processing nodes further includes:
   generating instructions that are compliant with instructions specified in Conjugate Virtual Machine (CVM) fields of the interconnected design vectors.

6. The method of claim 1, wherein mapping the interconnected design vectors to dedicated hardware processing nodes further includes:
   generating glue elements needed to stitch together a sequencer and instructions.

7. The method of claim 6, wherein mapping the interconnected design vectors to dedicated hardware processing nodes further includes:
   generating an instruction bus element needed to stitch together a sequencer and instructions.

8. The method of claim 7, wherein mapping the interconnected design vectors to dedicated hardware processing nodes further includes:
   generating a memory bus element needed to stitch together a sequencer and instructions.

* * * * *